US 7,497,716 B2

(12) United States Patent
Hsu et al.

(10) Patent No.: US 7,497,716 B2
(45) Date of Patent: Mar. 3, 2009

(54) ELECTRICAL CONNECTOR

(75) Inventors: Hsiu-Yuan Hsu, Tu-Cheng (TW);
Jia-Hau Liu, Tu-Cheng (TW)

(73) Assignee: Hon Hai Precision Ind. Co., Ltd.,
Taipei Hsien (TW)

( * ) Notice: Subject to any disclaimer, the term of this patent is extended or adjusted under 35 U.S.C. 154(b) by 0 days.

(21) Appl. No.: 11/811,727

(22) Filed: Jun. 12, 2007

(65) Prior Publication Data

US 2008/0006912 A1 Jan. 10, 2008

(51) Int. Cl.
*H01R 13/62* (2006.01)

(52) U.S. Cl. ...................................... 439/331

(58) Field of Classification Search ................. 439/330, 439/331, 70–73
See application file for complete search history.

(56) References Cited

U.S. PATENT DOCUMENTS

| 6,485,320 | B1* | 11/2002 | Ma | 439/342 |
| 6,648,656 | B1* | 11/2003 | Ma | 439/73 |
| 6,722,909 | B1* | 4/2004 | McHugh et al. | 439/331 |
| 6,875,038 | B1* | 4/2005 | McHugh et al. | 439/331 |
| 7,160,128 | B2* | 1/2007 | Ma | 439/331 |
| 2004/0018755 | A1* | 1/2004 | Ma | 439/73 |
| 2004/0058567 | A1* | 3/2004 | Ma | 439/73 |
| 2004/0121630 | A1* | 6/2004 | Ma et al. | 439/73 |
| 2004/0259407 | A1* | 12/2004 | Chiang | 439/331 |
| 2005/0106905 | A1* | 5/2005 | Ma | 439/73 |
| 2005/0106923 | A1* | 5/2005 | Ma | 439/331 |
| 2007/0155215 | A1* | 7/2007 | Hsu | 439/331 |
| 2007/0254500 | A1* | 11/2007 | Chiang | 439/71 |
| 2008/0057751 | A1* | 3/2008 | Zhang | 439/73 |

* cited by examiner

*Primary Examiner*—Ross N Gushi
(74) *Attorney, Agent, or Firm*—Wei Te Chung

(57) ABSTRACT

An electrical connector (1) comprises a housing (1) fixed on a PCB, a metal cover (40) pivotally mounted to the housing (10), and a lever (50) attached to the housing (10). The housing (10) defines a plurality of passageways receiving a plurality of terminals (20) therein. The cover (40) defines a first side (401) with a tongue portion (4010), a second side (402) opposite to the first side (401) and a third side (403) and a fourth side (404) opposite to the third side (401) connecting the first side (401) and the second side (402). The third and the fourth side (401, 402) define as an arched configuration and project toward the housing, and the first and the second sides (403, 404) define at least one projection (405) respectively.

14 Claims, 5 Drawing Sheets

ELECTRICAL CONNECTOR

BACKGROUND OF THE INVENTION

1. Field of the Invention

The present invention relates to an electrical connector for electrically connecting an electronic package with a printed circuit board.

2. Description of Prior Art

Electrical connectors are widely used in personal computer (PC) systems to electrically connect chip modules with printed circuit boards (PCBs). An electrical connector comprises an insulative housing, a multiplicity of terminals received in the housing in a rectangular array, a metal cover pivotally mounted to the housing, and a lever attached to the housing and a stiffener mounted on a lower end of the housing.

A conventional connector 1 shown in FIGS. 1-3 comprises an insulative housing 10 fixed on a PCB (not shown), a plurality of terminals 20 an operational lever 50 engaged with the housing 10, and a metal cover 40 mounted to the housing 10. The housing 10 defines a plurality of passageways (not shown) receiving a plurality of terminals 20 (not shown) therein, and comprises a curved tongue member 400 in a side portion (not labeled) thereof and a tail portion 401 in an opposite side thereof and a pair of connecting sides connecting the tongue portion 400 and the tail portion 401. The connecting sides projects outwardly towards housing 10. The housing 10 defines a conducting section 200, which defines a plurality of passageways for receiving terminals 20 therein.

In assembly, the cover 40 is first oriented to an open position for mounting the chip module 2 on the housing 10. Successively, The cover 40 is closed and the lever 50 is pushed to lock with the stiffener 72. Due to the connecting sides being defined as arched configuration, the chip module 2 contacts with the cover 40 with a point contact, which leads to a non-uniform force applied on the chip module 2. The cover 40 applies a downward force on the chip module 2 from each contacting point. While the terminals 20 produce a well-distribute force to the housing 10, which do not compensate by the force applied by the cover 40. Therefore, the chip module 2 is prone to produce an upwardly deformation.

A new electrical connector that overcomes the above-mentioned problems is desired.

SUMMARY OF THE INVENTION

An object of the present invention is to provide an electrical connector able to balance the force applied on the chip module and prevent the chip module from deformation.

In order to achieve the above object, an electrical connector in accordance with a preferred embodiment of the present invention comprises a housing fixed on a PCB, a metal cover pivotally mounted to the housing, and a load lever attached to the housing. The housing defines a plurality of passageways receiving a plurality of terminals therein. The cover defines a first side with a tongue portion, a second side opposite to the first side and a third side and a fourth side opposite to the third side connecting the first side and the second side. The third and the fourth side define as an arched configuration and project toward the housing, and the first and the second side define at least one projection respectively.

The projection on the third side and the fourth side of the electrical connector of the invention provide an enlarged contacting surface between the chip module and the cover hence improve the force distribute applied on the chip module.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
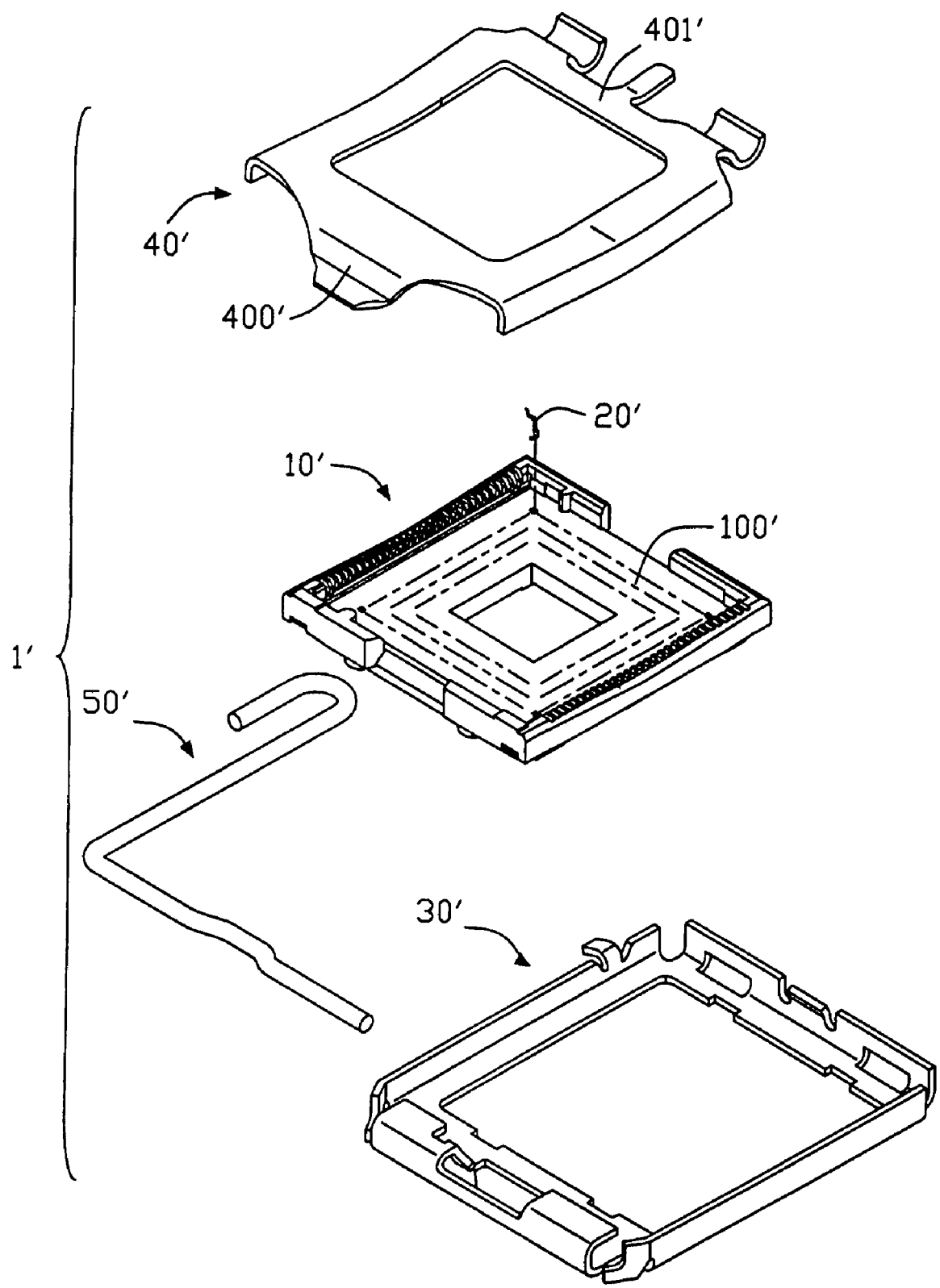
FIG. 1 is a simplified exploded, isometric view of a conventional electrical connector.
Figure 2:
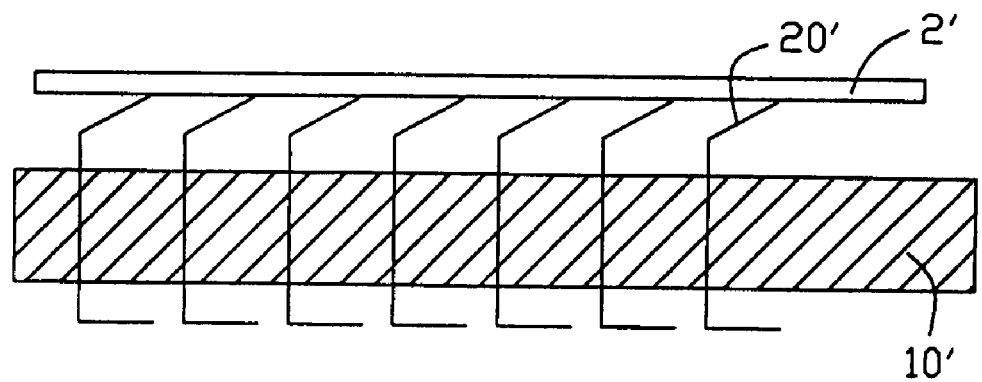
FIG. 2 is a perspective view of the electrical connector assembled with a chip module, but the cover do not abut against the chip module.
Figure 3:
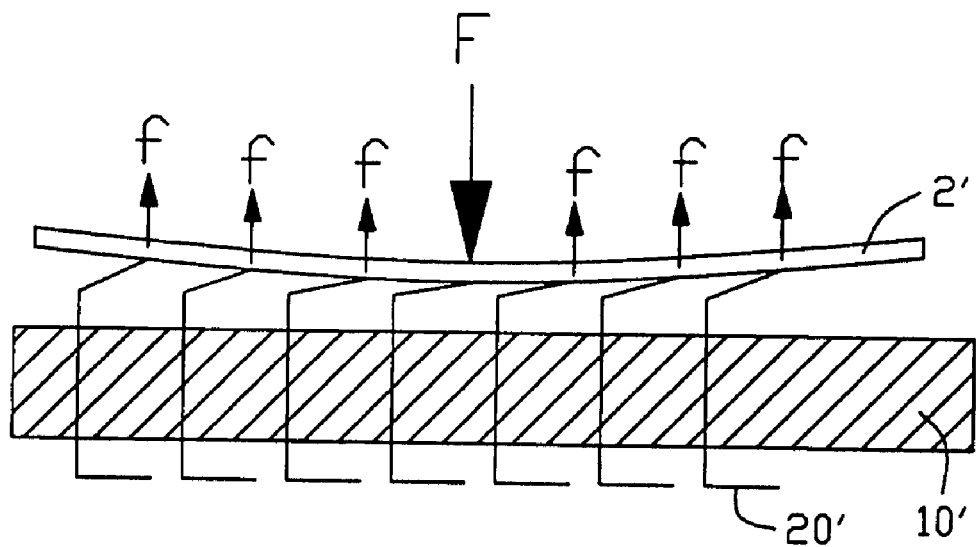
FIG. 3 is a perspective view of the electrical connector assembled in a chip module, wherein the cover abut against the chip module.
Figure 4:
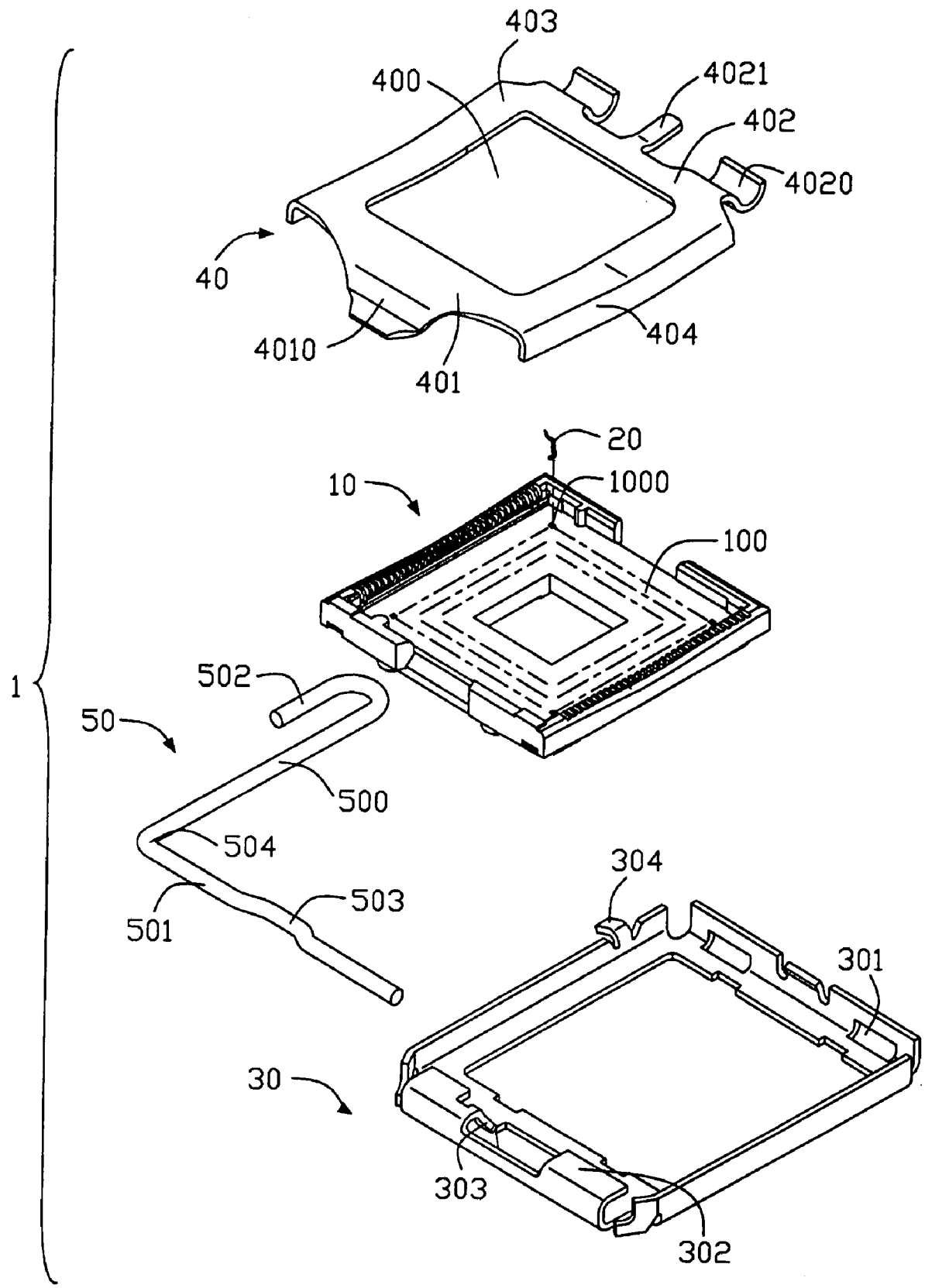
FIG. 4 is a simplified, exploded isometric view of an electrical connector in accordance with the preferred embodiment of the present invention.
Figure 5:
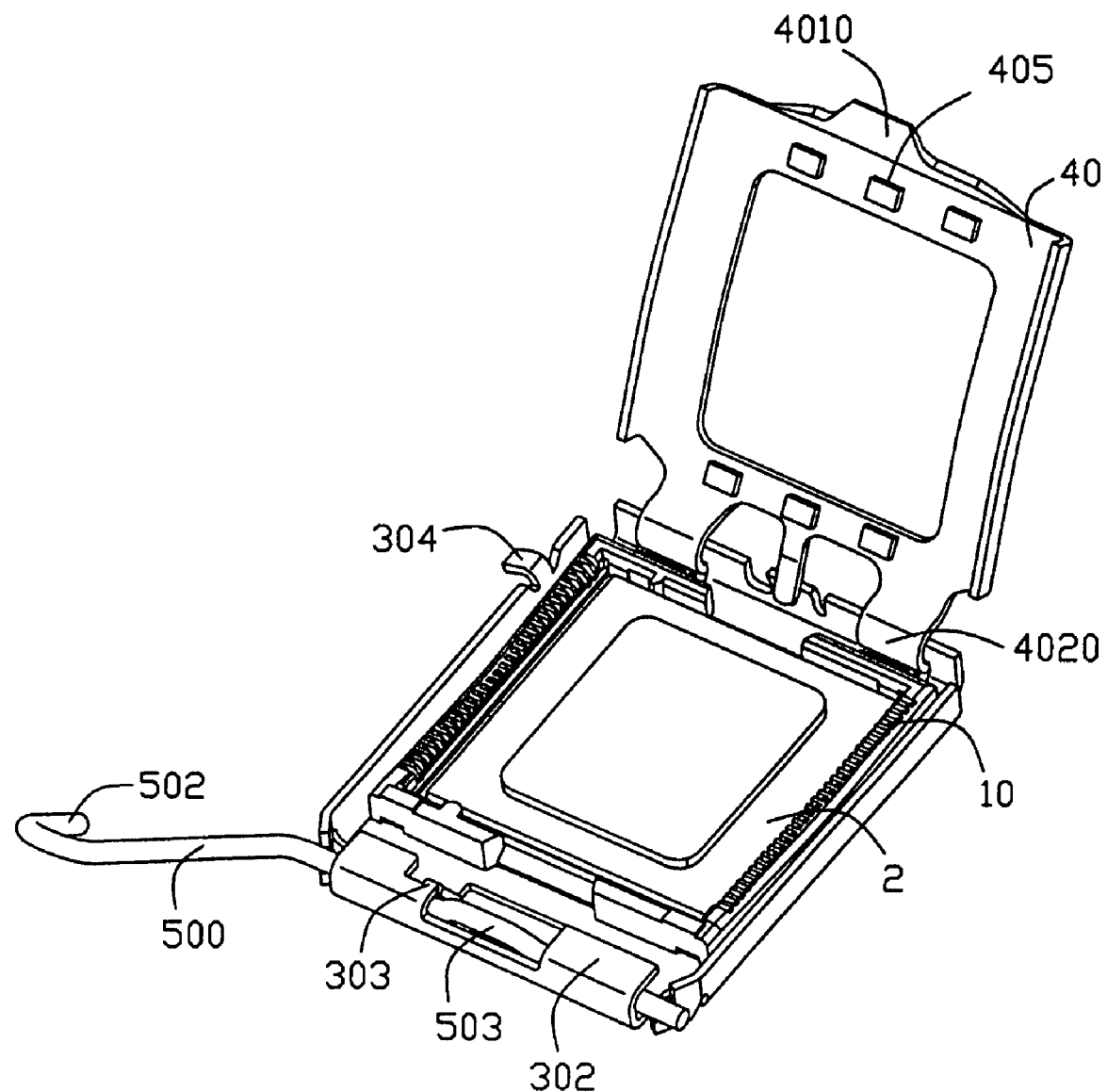
FIG. 5 is an assembled view of the electrical connector shown in FIG. 4, wherein the cover is open.
Figure 6:
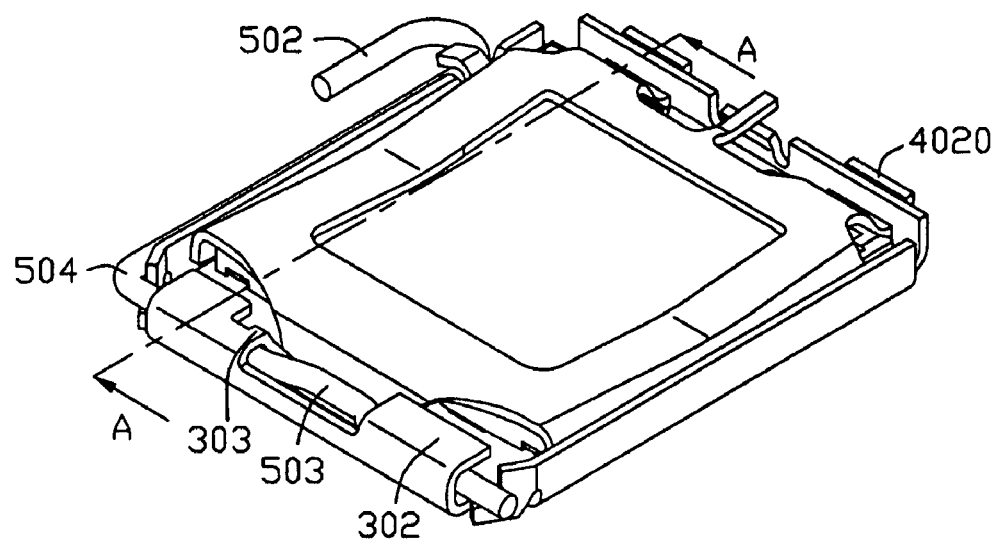
FIG. 6 is an assembled view of the electrical connector shown in FIG. 4.
Figure 7:
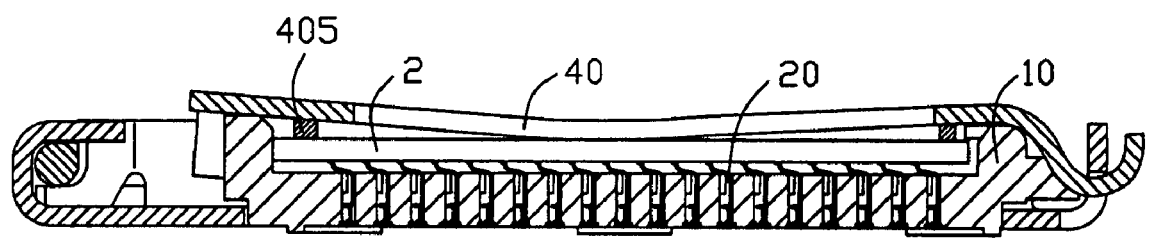
FIG. 7 is a cross-section of the electrical connector shown in FIG. 6 in line with I-I.

Referring to FIGS. 4-7, an electrical connector 1 in accordance with the preferred embodiment of the present invention is adapted for electrically connecting an electronic package such as a chip module 2 with a circuit substrate such as a printed circuit board (PCB). The electrical connector 1 comprises a housing 10 positioned above the PCB, a metal cover 40 pivotally mounted to the housing 10, a metal stiffener 30 surrounding the housing 10 and a lever 50 engaged with the housing 10.

The housing 10 comprises a conducting portion 100 defining a plurality of passageways 1000 for receiving the terminals 20 therein. One end of the terminal 20 extends beyond a top surface of the conducting portion 100 for connecting with the chip module 2. The other end of the terminal 20 is soldered a ball for connecting to the printed circuit board. At last, the chip module 2 is connected with the printed circuit board by the terminals 2.

The lever 50 is mode of slim metal pole and comprises an actuator 500 and a securing portion 501 perpendicular to the actuator 500, an operating portion 502 disposed on a distal end of the actuator 500, a pressing portion 503 at a center position of the securing portion 501. The actuator 500 is fundamentally perpendicular to the securing portion 501 and connected with each other by a bending portion 504.

The cover 40 is a hollow frame and comprises four sides and a receiving room 400 formed by the four sides cooperatively. The four sides comprise a first side 401 defining a tongue portion 4010 corresponding to the pressing portion 503 of the lever 50, a second side 402 defining a pair of symmetrical hooks 4020 and a tail 4021 sandwiched between the hooks 4020, a third side 403 and a fourth side 404 opposite to the third side 403 projecting outwardly toward the housing 10 and configured as arched shape. In addition, the first lateral side 401 and the second lateral side 402 define a plurality of projection 405 for abutting against the chip module 2. The arched third side 403 and the arched fourth side 404 abut against the chip module 2 with projecting portions, and the projections 405 of the first and second sides 401, 402 abut against the chip module 2 at same time, which provide an enlarged contacting surface between the chip module 2 and the cover 40. So the chip module 2 attains a balance force situation.

The stiffener 30 comprises two pairs of lateral edges and sidewalls extending from the edges, a pair of opening 301 defined corresponding to the latches 4030 for connecting the cover 40 to the stiffener 30. The stiffener 30 further comprises a curved upwardly anchoring tab 302 corresponding with the securing portion 501 of the lever 50 and one of anchoring tabs 302 defines a retaining tab 303 on an end thereof. The anchoring tabs 302 and the retaining tab 303 are used for cooperatively positioning the lever 50 to the stiffener 30 and the stiffener 30 defines a plurality of hooks 304 on the side adjacent to the opening 301 for engaging with the lever 50.

In assembly, the electrical connectors 1 is firstly soldered to the printed circuit board, and then the cover 40 is open and the lever 50 is pushed pivotally to make the cover 40 from a vertical position to a horizontal position for pressing the chip module 2 on the housing 10 tightly. At this moment, the projecting portions and the projections 405 on the third and fourth sides 403, 404 abut against the upper surface of the chip module 2 and produce a uniformity force on the chip module 2, which can compensate the force applied by the terminals 20, hence ensuring the chip module 2 a balance-stressing situation.

It is to be understood that distances between the projections 405 on the first side 401 and the second side 402 can be altered in line with the dimension of the chip module 2 for providing a fitly pressing force to avoid the deformation of the chip module 2. In addition, the configuration of the projection 405 can be chose from circle, semi-circle or other shape. Conventionally, the cover 40 and the lever 50 are mounted on two opposite sides of the stiffener 30, however the cover 40 and the lever 30 can be mounted on same side of the housing 10 too for some reason. At some situation, the stiffener 30 can be omitted and the lever 50 and the cover 40 are mounted on the housing 10 at this time.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting a chip module with a circuit substrate, the electrical connector comprising:
    a housing mounted on the circuit substrate, the housing defining a plurality of passageways;
    a plurality of terminals received in the passageways of the housing
    a cover bowing toward the housing so as for pressing the chip module toward the housing, and defining a window and a bowing point located adjacent a central portion thereof;
    wherein flatness counter-arrangements under a surface of the cover at opposite sides of the bowing point and being located at an exterior of the window such that the bowing point is balanced.

2. The electrical connector according to claim 1, wherein the insulative housing includes an inner housing for receiving the chip module and an outer housing for receiving the metallic reinforcing stiffener.

3. The electrical connector according to claim 1, wherein the cover is pivotally mounted on the first end of the insulative housing by the reinforcing stiffener.

4. The electrical connector as claimed in claim 1, wherein the housing further includes a stiffener, and the cover is pivotally assembled an end thereof.

5. The electrical connector as claimed in claim 4, wherein flatness counter-arrangement is configured as at least one projection defined on at least one of the first side and the second side for abutting against the chip module.

6. The electrical connector as claimed in claim 5, further comprising a stiffener mounted around the housing and a lever engaged with the stiffener.

7. The electrical connector as claimed in claim 5, wherein the projection is rigid and defined on a central portion of each first side and second side.

8. The electrical connector as claimed in claim 1, wherein the cover pivotally mounted to the housing comprises a first side, a second side opposite to the first side, and a third side and a fourth side connecting with the first side and the second side in a front-to back direction, the bowing point being arranged on the third side and the fourth side.

9. The electrical connector as claimed in claim 8, wherein said projections can be configured as circle, semi-circle or other shapes.

10. The electrical connector as claimed in claim 9, wherein the cover defines a pair of hooks for engaging with the stiffener.

11. An electrical connector for retaining a chip module therein, comprising:
    an insulative housing defining an upper face with a chip module receiving cavity defined thereon;
    a plurality of contacts disposed in the housing and including an upper contacting section upwardly extending beyond the upper face;
    a cover pivotal relative to the housing and covering the chip module receiving cavity; wherein
    said cover is bowed and forming an upward concave in a top face for reinforcement to resist downward forces upon two opposite ends thereof, while an underside of the cover is arranged to provide a dispersing contacting structures facing the chip module receiving cavity and located essentially in a common plane so as to assure an even pressure imposed upon the chip module, if assembled, from said cover, said dispersing contacting structures including some downward projections located on a bottom face of the cover around said two opposite ends, said downwardly projections being discrete from the cover but attached thereto.

12. The electrical connector as claimed in claim 11, wherein at least two of said downward projections are evenly arranged along an edge region at each of said opposite ends.

13. An electrical connector for electrically connecting a chip module with a circuit substrate, the electrical connector comprising:
    a housing mounted on the circuit substrate, the housing defining a plurality of passageways;
    a plurality of terminals received in the passageways of the housing
    a cover bowing toward the housing so as for pressing the chip module toward the housing, and defining a window and a bowing point located adjacent a central portion thereof;
    wherein flatness counter-arrangements under a surface of the cover at opposite sides of the bowing point and being located at an exterior of the window such that the bowing point is balanced, the flat counter-arrangements being discrete from the cover but attached thereto.

14. The electrical connector as claimed in claim 13, wherein said flat-counter-arrangements are evenly located along an end edge region at each of said opposite sides.

* * * * *